United States Patent
Watanabe et al.

(10) Patent No.: US 7,741,986 B2
(45) Date of Patent: Jun. 22, 2010

(54) METHOD FOR CONTROLLING DELAY TIME OF PULSE DELAY CIRCUIT AND PULSE DELAY CIRCUIT THEREOF

(75) Inventors: Takamoto Watanabe, Nagoya (JP); Shigenori Yamauchi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 22 days.

(21) Appl. No.: 12/292,761

(22) Filed: Nov. 25, 2008

(65) Prior Publication Data

US 2009/0135040 A1    May 28, 2009

(30) Foreign Application Priority Data

Nov. 28, 2007    (JP) .............................. 2007-307521

(51) Int. Cl.
*H03M 1/60* (2006.01)

(52) U.S. Cl. ....................... 341/157; 341/155; 341/161; 341/166

(58) Field of Classification Search ................. 341/155, 341/157, 161, 166; 368/113–120
See application file for complete search history.

(56) References Cited

U.S. PATENT DOCUMENTS

| | | | |
|---|---|---|---|
| 5,128,624 A | 7/1992 | Hoshino et al. | |
| 5,289,135 A | 2/1994 | Hoshino et al. | |
| 5,416,444 A * | 5/1995 | Yamauchi et al. | ............ 331/45 |
| 5,568,071 A | 10/1996 | Hoshino et al. | |
| 6,466,151 B2 * | 10/2002 | Nishii et al. | ................ 341/155 |
| 6,643,584 B1 | 11/2003 | Ikeuchi et al. | |
| 6,771,103 B2 * | 8/2004 | Watanabe et al. | ........... 327/161 |
| 6,961,015 B2 * | 11/2005 | Kernahan et al. | ........... 341/165 |
| 6,977,605 B2 * | 12/2005 | Lee et al. | ..................... 341/161 |
| 7,106,239 B1 * | 9/2006 | Keskin | ........................ 341/157 |
| 7,248,197 B2 * | 7/2007 | Watanabe | .................... 341/155 |
| 7,268,719 B2 * | 9/2007 | Terazawa et al. | ............ 341/157 |
| 7,292,176 B1 * | 11/2007 | Chen et al. | ................... 341/157 |
| 7,315,270 B2 * | 1/2008 | Maksimovic et al. | ....... 341/157 |
| 7,450,049 B2 * | 11/2008 | Yamauchi et al. | ........... 341/157 |
| 7,525,471 B2 * | 4/2009 | Prodi et al. | .................. 341/157 |
| 7,652,604 B2 * | 1/2010 | Parayandeh et al. | ......... 341/143 |
| 2002/0175722 A1 | 11/2002 | Mano et al. | |
| 2003/0201927 A1 | 10/2003 | Watanabe et al. | |

FOREIGN PATENT DOCUMENTS

JP    H03-220814    9/1991

(Continued)

OTHER PUBLICATIONS

Office Action dated Sep. 15, 2009 in the corresponding Japanese patent application No. 2007-307521 (and English translation).

*Primary Examiner*—Linh V Nguyen
(74) *Attorney, Agent, or Firm*—Posz Law Group, PLC

(57) ABSTRACT

An inverter circuit configuring a delay unit is a so-called CMOS transistor including a PMOS transistor and an NMOS transistor, of which respective gates are interconnected and respective drains are interconnected. The source and a back gate of the NMOS transistor are connected to the ground. The source of the PMOS transistor is connected to a positive drive terminal and controlled by an analog input signal. The back gate of the PMOS transistor is connected to a control terminal and controlled by a control signal.

12 Claims, 5 Drawing Sheets

FOREIGN PATENT DOCUMENTS

| | | |
|---|---|---|
| JP | A-2002-246882 | 8/2002 |
| JP | A-2002-353809 | 12/2002 |
| JP | A-2004-007385 | 1/2004 |
| JP | 2004-077385 | 3/2004 |
| JP | A-2006-033061 | 2/2006 |
| JP | 2007-006368 | 1/2007 |
| WO | WO 00/04638 | 1/2000 |

* cited by examiner

METHOD FOR CONTROLLING DELAY TIME OF PULSE DELAY CIRCUIT AND PULSE DELAY CIRCUIT THEREOF

CROSS-REFERENCE TO RELATED APPLICATION

This application is related to Japanese Patent Application No. 2007-307521 filed on Nov. 28, 2007, the contents of which are hereby incorporated by reference.

BACKGROUND OF THE INVENTION

1. Field of the Invention

The present invention relates to a pulse delay circuit and a driving method thereof, and an analog-to-digital (A/D) conversion circuit and a time measurement circuit that use the pulse delay circuit. The pulse delay circuit includes delay units that delay signals, the delay units serially connected in a plurality of stages or connected to form a ring circuit.

2. Description of the Related Art

Conventionally, circuits that use a pulse delay circuit are known. The pulse delay circuit includes delay units serially connected in a plurality of stages or connected to form a ring circuit. A delay unit delays pulse signals by a delay time based on a voltage level of a drive signal. For example, as the circuits using the pulse delay circuit, an A/D conversion circuit (herein after called A/D converter) is disclosed in Japanese Patent Laid-open Publication No. 2007-6368 and a time measurement circuit is disclosed in Japanese Patent Laid-open Publication No. Heisei 3-220814.

Among these circuits, the A/D converter applies an analog signal to be converted from analog to digital as a drive signal of the pulse delay circuit. The A/D converter outputs numeric value data corresponding to the number of delay unit stages through which a pulse signal passes during a certain fixed amount of time, as A/D conversion data.

On the other hand, the time measurement circuit outputs the number of delay unit stages through which a pulse signal passes from when the pulse delay circuit is started by a start-up pulse signal until a measurement pulse signal is inputted, while a certain level of voltage is applied as a drive signal of the pulse delay circuit, as time measurement data indicating a time interval between both pulse signals. In the time measurement circuit, measurement resolution and measurement duration can be changed by a voltage level of the drive signal being changed.

FIG. 1 is a circuit diagram of a configuration of the delay unit configuring the pulse delay circuit.

As shown in FIG. 1, a delay unit DU is configured by inverter circuits INV being connected in two stages. An inverter circuit INV is configured by a known complementary metal-oxide semiconductor (CMOS) transistor. The CMOS transistor includes a p-type metal-oxide semiconductor (PMOS) transistor Tp and an n-type metal-oxide semiconductor (NMOS) transistor Tn of which respective gates G are interconnected and respective drains D are interconnected.

A drive signal Vin is applied to the source S of the PMOS transistor Tp on a positive side of the CMOS transistor. The source S of the NMOS transistor Tn on a negative side is grounded. Respective back gates B of the transistor Tp and transistor Tn are ordinarily connected to respective sources S of the transistor Tp and transistor Tn.

On-resistance of both transistor Tp and transistor Tn configuring the inverter circuit INV increases when a voltage level of the drive signal Vin decreases. Then time required for charge and discharge of a gate-capacitance of the inverter circuit INV at a next stage increases. As a result, the delay time of the inverter circuit INV and, therefore, of the delay unit DU increases.

Here, FIG. 2 is a graph showing a relationship between the number of delay unit DU stages (referred to, hereinafter, as a count value) through which a pulse signal PA passes within the pulse delay circuit and elapsed time, at each voltage level (here, three levels: maximum, intermediate, and minimum) of the drive signal Vin. However, the delay time of the delay unit DU differs between solid lines and dotted lines. An instance indicated by a dotted line has half the delay time as that of an instance indicated by a solid line.

As is clear from FIG. 2, when the delay time of the delay unit DU is halved, time required to reach the same count value is halved.

In the A/D converter using the pulse delay circuit, the voltage resolution of A/D conversion data when the measurement time is Ta corresponds to a difference $\Delta C$ between a count value obtained when the drive signal Vin is at a maximum voltage and a count value obtained when the drive signal Vin is at a minimum voltage, at time Ta in the graph. The voltage resolution improves as the $\Delta C$ increases.

Moreover, in the time measurement circuit using the pulse delay circuit, the delay time of the delay unit directly becomes time resolution. A maximum measurement time is determined by a maximum count value and the time resolution.

In the A/D converter using the pulse delay circuit, to improve the voltage resolution of the A/D conversion data (in other words, to increase $\Delta C$ in the graph), the measurement time Ta is required to be extended. When the measurement time Ta is not changed, the delay time of the delay unit DU is required to be shortened.

However, when the measurement time Ta is extended without changing the delay time of the delay unit DU, or when the delay time of the delay unit DU is shortened without changing the measurement time Ta, in both instances, the maximum count value increases. Therefore, the size of the circuit of a circuit for counting the number of stages of delay units through which the pulse signal passes increases, thereby increasing the size of the circuit of the overall A/D converter.

In particular, when the measurement time Ta is extended, the circuit cannot be used for purposes requiring high-speed control.

A more advanced semiconductor manufacturing technology (i.e., process technology) with more advanced size-reduction techniques is required as the delay time of the delay unit DU becomes shorter. Therefore, manufacturing costs increase. Moreover, when a voltage resolution exceeding the capability of the process technology is required, such requirements cannot be met by reliance solely on the process technology.

On the other hand, in the time measurement circuit using the pulse delay circuit, the measurement duration can be increased by the voltage level of the drive signal being decreased and the delay time of the delay unit deign increased. However, to allow measurement over a longer measurement duration exceeding the duration controllable by the drive signal, a configuration is required that allows counting to a larger count value. Alternatively, a plurality of pulse delay circuits configured by delay units having different delay times are required to be provided, and a configuration that switches between the pulse delay circuits for each measurement subject is required. In any case, the size of the time measurement circuit increases.

SUMMARY OF THE INVENTION

To solve the above-described issues, an object of the present invention is to provide a pulse delay circuit that can improve performance of A/D converters and time measurement circuits without using an advanced process technology, a driving method thereof, and an A/D converter and a time measurement circuit using the pulse delay circuit.

To achieve the object of the present invention, a method for driving a pulse delay circuit that generates propagation delay for a pulse signal to be transmitted through the pulse delay circuit comprising steps of:

forming a delay unit comprising of a plurality of transistors that include a specific transistor;

electrically connecting a plurality of delay units with each other to form the pulse delay circuit for giving the propagation delay to the pulse signal that is successively delayed by each of the delay units; and applying signals that drive the pulse delay circuit in order to change a delay time of the each delay unit, wherein the signals driving the pulse delay circuit include a first signal that drives a first terminal of the specific transistor in the delay unit, a second signal that drives a second terminal of the specific transistor in the delay unit and the voltages of the first and second signals are controlled separately in order to produce a change in on-resistance of the specific transistor that causes a change in the delay time of each delay unit.

In this method of driving the pulse delay circuit, the change in the on-resistance in relation to a change in the voltage of the first terminal (i.e., source voltage) in the specific transistor becomes larger compared with a change in the on-resistance when the first and the second terminal of the specific transistor are tied together (i.e., the first and second terminal show the same voltage). As a result, a change in the delay time of the delay unit in relation to the change in the first signal (drive signal) or, in other words, the delay duration of the delay unit controllable by the first signal becomes greater.

FIG. 3 is a graph showing the relationship between the number of delay unit stages (referred to, hereinafter, as a count value) through which a pulse signal passes within the pulse delay circuit, and elapsed time, at each voltage level (here, three levels: maximum, intermediate, and minimum) of the drive signal. However, solid lines indicate when a conventional driving method is used, in which the back gate voltage is equal to the source voltage of the specific transistor. Dotted lines indicate when a driving method that is an example of the present invention is used, in which the on-resistance of the specific transistor is controlled by the back gate voltage of the specific transistor being a certain voltage (herein, a maximum voltage level of the drive signal).

As shown in FIG. 3, a difference $\Delta C$ between a count value obtained when the drive signal is at the maximum voltage level and a count value of when the drive signal is at a minimum voltage level is greater when the driving method of the present invention is used, if the measurement time Ta is the same.

When the driving method of the present invention is used, the delay time of the delay unit can be increased. Therefore, time required to reach the same count value can be further increased.

Therefore, when the driving method of the present invention is applied to a pulse delay circuit configuring an A/D converter, voltage resolution of A/D conversion data can be improved without shortening the delay time of the delay unit or increasing the size of the circuit. When the driving method of the present invention is applied to a pulse delay circuit configuring a time measurement circuit, a measurable time range can be widened without increasing the size of the circuit.

As a specific method of increasing change in the on-resistance of the specific transistor, when the specific transistor is a PMOS transistor, a certain voltage set to a maximum voltage of the drive signal or higher can be used as the control signal. Alternatively, a voltage value that is even higher than the maximum voltage of the drive signal can be used as a difference between the voltage level of the drive signal and the maximum voltage of the driving signal becomes greater.

When the specific transistor is a NMOS transistor, a certain voltage set to a minimum voltage of the drive signal or lower can be used as the control signal. Alternatively, a voltage value that is further lower than the minimum voltage of the drive signal can be used as a difference between the voltage level of the drive signal and the minimum voltage of the driving signal becomes greater.

When the control signal is a certain voltage, a configuration for generating the control signal can be simplified. When the control signal is a variable voltage, the change in the delay time of the delay unit in relation to the change in the drive signal can become greater.

A pulse delay circuit of the present specification is configured by delay units serially connected in a plurality of stages or connected to form a ring circuit. A delay unit delays a pulse signal by a delay time based on a voltage level of a drive signal. The pulse delay circuit transmits the pulse signal while successively delaying the pulse signal by the delay time of the delay unit.

The delay unit includes a single gate circuit or gate circuits serially connected in a plurality of stages. The gate circuit includes at least a specific transistor configured by a metal-oxide semiconductor of which the pulse signal is applied to a gate and the drive signal is applied to a source.

The pulse delay circuit includes a control terminal for applying a control signal to a back gate of the specific transistor. The control signal is used to control a back gate voltage such that a change in on-resistance of the specific transistor in relation to a voltage level of the drive signal is greater than that when the back gate voltage is equal to a source voltage of the specific transistor.

In this way, the pulse delay circuit of the present invention includes the control terminal to which the control signal for controlling the back gate voltage of the specific transistor is applied. Therefore, the above-described driving method can be performed.

When the gate circuit is configured using the CMOS transistor, the specific transistor can be one of a PMOS transistor and an NMOS transistor configuring the CMOS transistor.

An inverter circuit can be used as the gate circuit. However, the inverter circuit is not limited to the gate circuits. Other logic circuits can be used.

The pulse delay circuit of the present invention can include a control signal generation circuit that generates the above-described control signal and supplies the control terminal with the control signal.

Next, an A/D converter of the present specification is configured using any of the above-described pulse delay circuits. An encoding circuit generates numeric data corresponding to the number of delay unit stages through which the pulse signal passes within the pulse delay circuit during a measurement time set in advance.

In addition, an analog input signal to be converted from analog to digital is applied to the pulse delay circuit as the drive signal and the numeric data generated by the encoding circuit is outputted as A/D conversion data indicating a voltage level of the analog input signal.

In the A/D converter of the present invention, configured as described above, the control signal is supplied to the control terminal provided in the pulse delay circuit, and the back gate voltage of the specific transistor configuring the delay unit is controlled. As a result, the voltage resolution of the A/D conversion data can be improved without the delay time of the delay unit being shortened or a the size of the circuit being increased.

When the same voltage resolution is obtained, the measurement time can be shortened compared to the conventional circuit in which the back gate voltage equal to the source voltage of the specific transistor.

A time measurement circuit of the present specification is configured using any of the above-described pulse delay circuits. A voltage setting circuit variably sets a drive voltage of the pulse delay circuit. An encoding circuit generates numeric data corresponding to the number of delay unit stages through which the pulse signal passes within the pulse delay circuit during a specified measurement time.

Specifically, when a start-up pulse is inputted from an external source, the pulse delay circuit starts transmission of the pulse signal and a measurement pulse is inputted from the external source at a time of the specified measurement time passed. Then, the encoding circuit generates the numeric data and outputs as a time measurement data indicating a time interval from an input timing of the start-up pulse to an input timing of the measurement pulse.

In the time measurement circuit of the present invention, configured as described above, the control signal is supplied to the control terminal provided in the pulse delay circuit, via the control terminal, and the back gate voltage of the specific transistor configuring the delay unit is controlled. As a result, the range of available delay time is greater when the drive voltage is changed by the voltage setting circuit, compared to the conventional circuit. Therefore, a measurable time range can be widened without the size of the circuit being increased.

DETAILED DESCRIPTION OF THE PREFERRED EMBODIMENTS

Embodiments of the present invention are hereafter described with reference to the drawings.

First Embodiment

Figure 4:
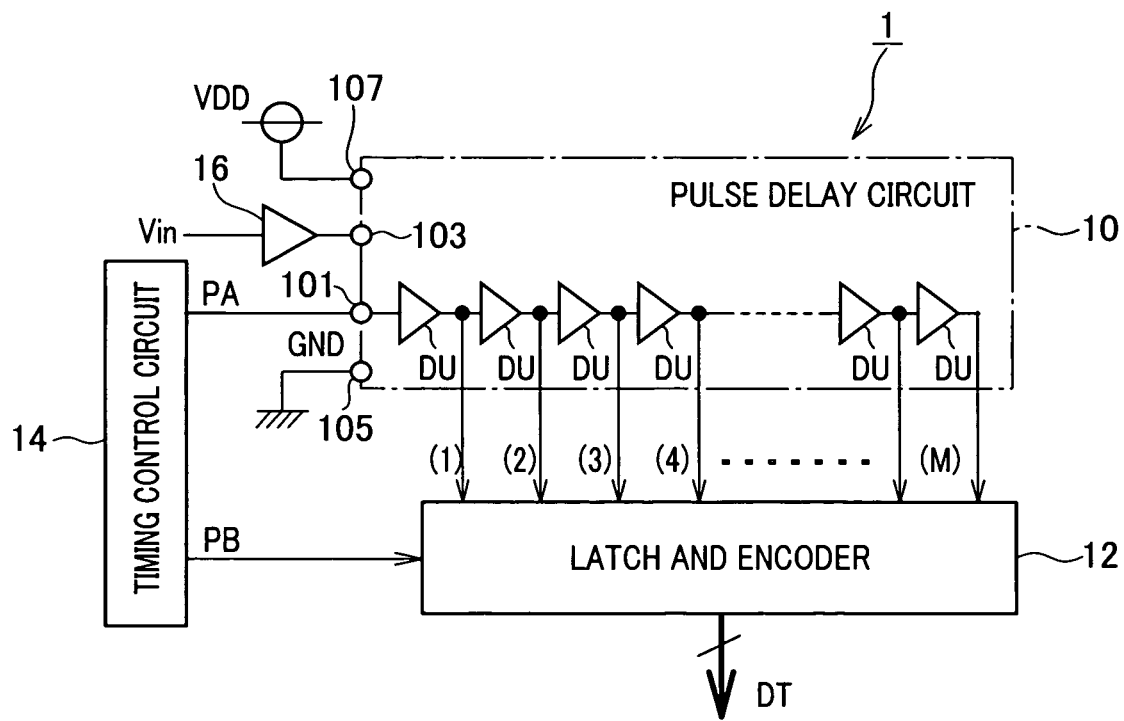
FIG. 4 is a block diagram showing a configuration of an A/D converter according to a first embodiment.

FIG. 4 is a block diagram showing an overall configuration of an A/D converter 1 to which the present invention is applied.

As shown in FIG. 4, the A/D converter 1 includes a pulse delay circuit 10, a latch and encoder 12, and a timing control circuit 14. The pulse delay circuit 10 is configured such that delay units DU are connected in a cascade configuration of M stages (M is a positive integer). A delay unit DU outputs a pulse signal PA after delaying the pulse signal PA by a predetermined delay time. The latch and encoder 12 serves as an encoding circuit that detects (latches) an arrival position of the pulse signal PA within the pulse delay circuit 10 at a rising timing of a sampling signal PB. The latch and encoder 12 then converts a detection result into digital data DT of a predetermined number of bits indicating the number of delay unit DU stages through which the pulse signal PA passed, and outputs the digital data DT as A/D conversion data. When an operation instruction is inputted from an external source (not shown), after a measurement time Ta set in advance has elapsed after generating the pulse signal PA supplied to the pulse delay circuit 10, the timing control circuit 14 generates the sampling signal PB supplied to the latch and encoder 12.

The pulse delay circuit 10 also includes a positive drive terminal 103, a negative drive terminal 105, and a control terminal 107, in addition to a pulse input terminal 101 into which the pulse signal PA from the timing control circuit 14 is inputted. An analog input signal Vin to be converted from analog to digital is applied to the positive drive terminal 103, via a buffer 16. The negative drive terminal 105 is grounded. A fixed voltage VDD (Vmax=VDD=5V according to the first embodiment) set to be a maximum voltage Vmax of the analog input signal Vin or higher is applied to the control terminal 107 as a control signal.

Numeric values indicated as (1), (2), and so on at an output of each delay unit DU in FIG. 4 indicate the number of delay unit DU stages.

Figure 5:
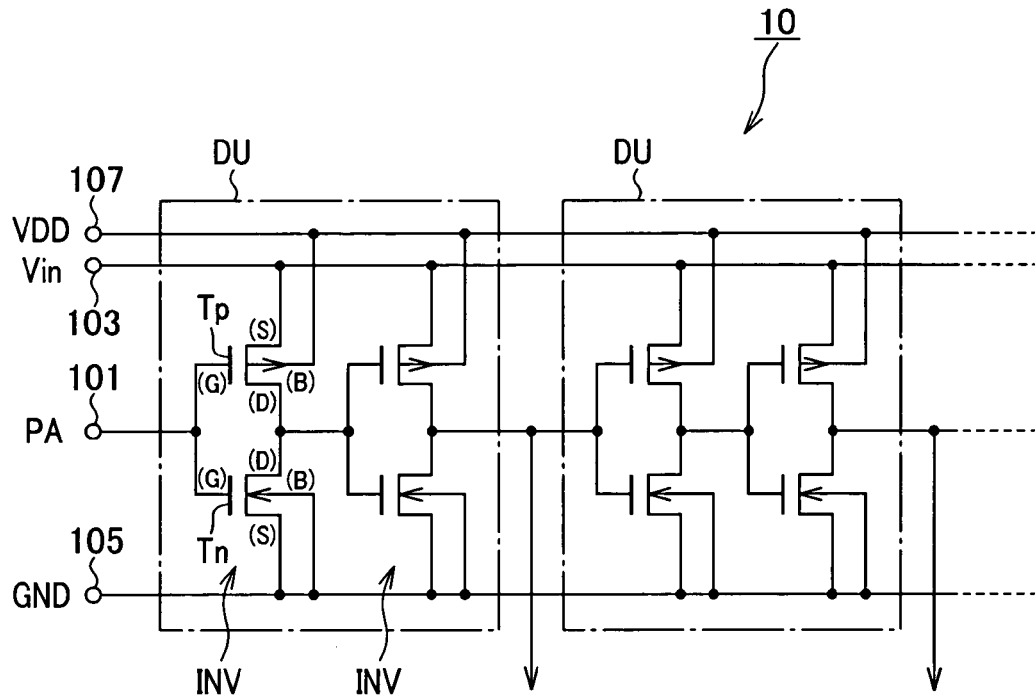
FIG. 5 is a circuit diagram showing a detailed configuration of a delay unit configuring a pulse delay circuit.

Here, FIG. 5 is a circuit diagram of a detailed configuration of the delay unit DU configuring the pulse delay circuit 10.

As shown in FIG. 5, the delay unit DU includes inverter circuits INV connected in a cascade configuration of two stages. An inverter circuit INV is configured by a CMOS transistor. The delay unit DU is configured to serve a buffer circuit that delays pulse signals supplied by a delay unit DU at a previous stage (however, a delay unit DU at the first stage is supplied the pulse signals from the pulse input terminal 101) and outputs the pulse signals.

The CMOS transistor configuring the inverter circuit INV includes a PMOS transistor Tp and an NMOS transistor Tn, of which respective gates G are interconnected and respective drains D are interconnected. A source S and a back gate B of the NMOS transistor Tn are connected to the negative drive terminal 105 (in other words, grounded). A source S of the PMOS transistor Tp is connected to the positive drive terminal 103 (in other words, the analog input signal Vin is applied). A back gate B of the PMOS transistor Tp is connected to the control terminal 107 (in other words, the fixed voltage VDD serving as the control signal is applied).

Hereafter, a transistor (the PMOS transistor Tp, herein) of which the analog input signal (drive signal: corresponding to first signal) Vin is applied to a source S (corresponding to first terminal) and the fixed voltage (control signal: corresponding to second signal) VDD is applied to a back gate B (corresponding to second terminal) is also referred to as a specific transistor.

In the A/D converter 1 configured as described above, the timing control circuit 14 into which an operation instruction is inputted supplies the pulse delay circuit 10 with the pulse signal PA. After supplying the pulse signal PA, the timing control circuit 14 supplies the latch and encoder 12 with the sampling signal PB that rises when the measurement time Ta has elapsed. The latch and encoder 12 outputs the A/D conversion data DT indicating the voltage level of the analog input signal Vin.

The pulse delay circuit 10 transmits the pulse signal PA inputted from the pulse input terminal 101 while successively delaying the pulse signal PA. At this time, the delay time of the delay unit DU changes in adherence to the voltage level of the analog input signal Vin. The delay time increases as the voltage level decreases.

However, a back gate voltage of the specific transistor Tp does not change with the voltage level of the analog input signal Vin and is held at the fixed voltage VDD. Therefore, compared to when the source and the back gate are connected, an on-resistance of the specific transistor Tp increases. As a result, when the voltage level of the analog input signal Vin is decreased, the rate by which the delay time changes (increases) becomes greater.

Figure 1:
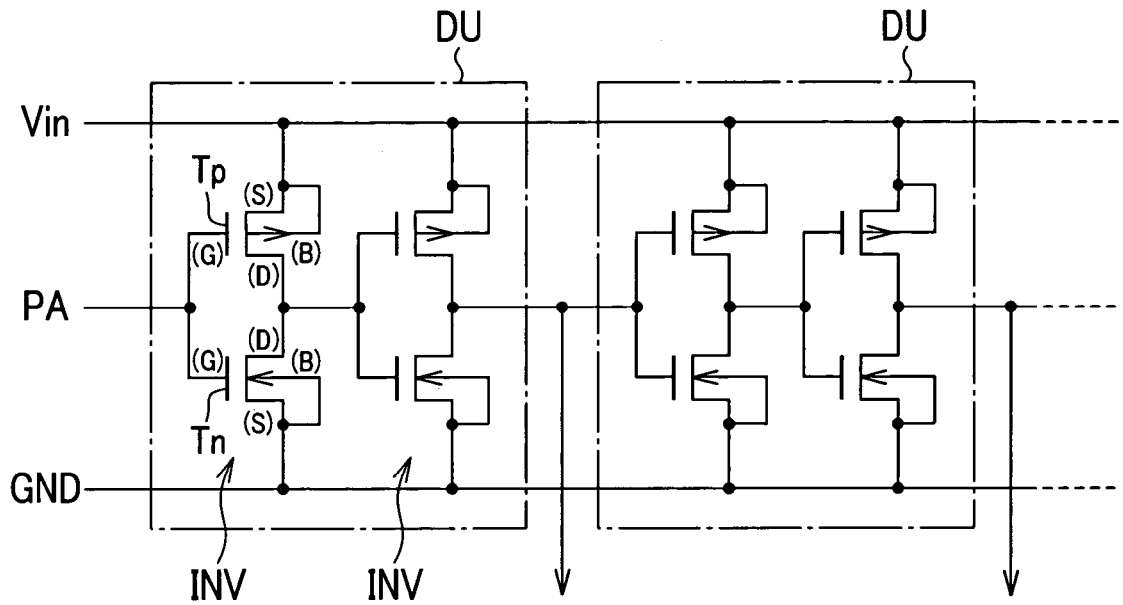
FIG. 1 is a circuit diagram showing a configuration of a conventional delay unit.
Figure 2:
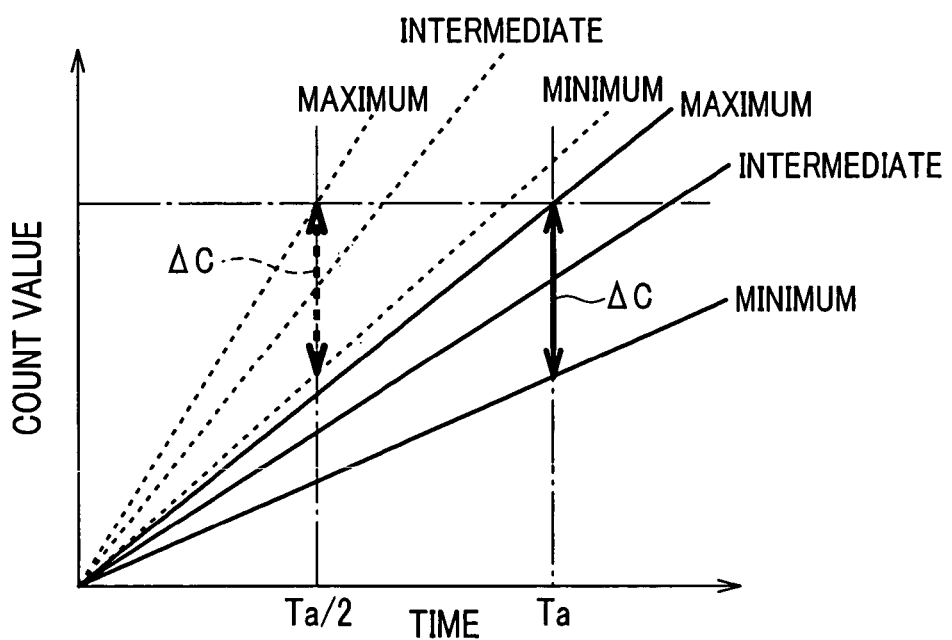
FIG. 2 is an explanatory diagram showing a problem occurring in an operation performed by the conventional pulse delay circuit.
Figure 3:
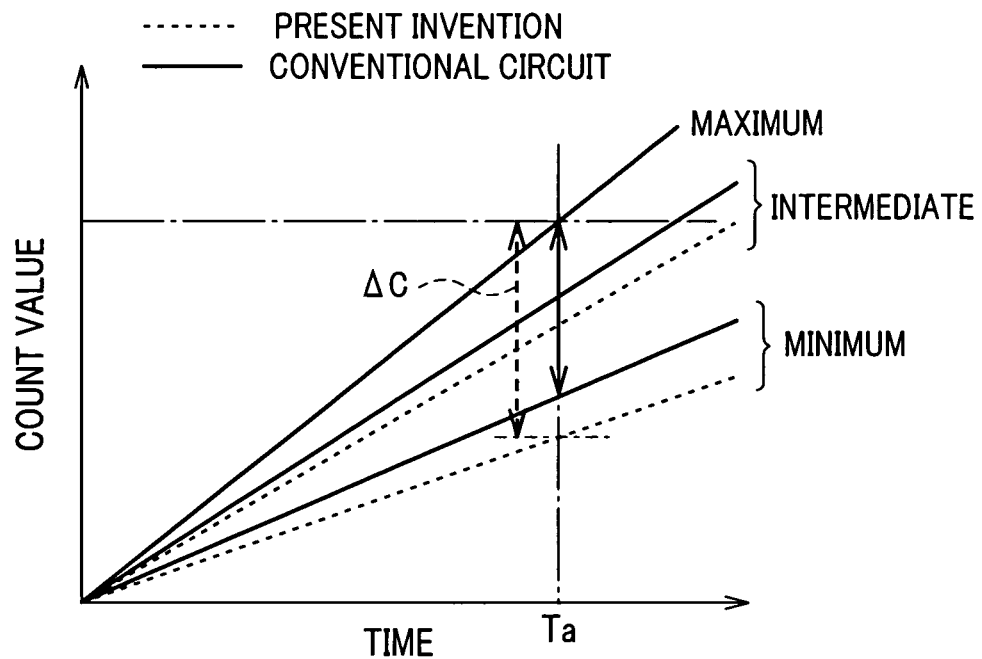
FIG. 3 is an explanatory diagram showing an operation performed by the pulse delay circuit.

In other words, as shown in FIG. 3, a difference (referred to, hereinafter, as a count value difference) ΔC between the number of delay unit DU stages passed (referred to, hereinafter, as a count value) obtained when the analog input signal Vin is at a maximum voltage and a count value obtained when the analog input signal Vin is at a minimum voltage is greater compared to that of a conventional circuit in which the source and the back gate of the specific transistor Tp are connected.

In FIG. 3, dotted lines indicate characteristics of the pulse delay circuit 10 according to the first embodiment. Solid lines indicate characteristics of the conventional circuit.

As described above, in the A/D converter 1, when the voltage level of the analog input signal Vin changes, the change in the on-resistance of the specific transistor Tp becomes greater than that of the conventional circuit in which the back gate voltage and a source voltage are electrically connected. Therefore, the back gate voltage of the specific transistor Tp is controlled such that the count value difference ΔC corresponding to the voltage resolution of the A/D conversion data becomes greater (in other words, voltage resolution becomes higher).

Accordingly, in the A/D converter 1, the voltage resolution of the A/D conversion data can be improved without shortening the delay time of the delay unit DU and extending the measurement time Ta or, in other words, significantly increasing the size of the circuit or manufacturing costs.

Second Embodiment

Next, a second embodiment will be described.

Figure 6:
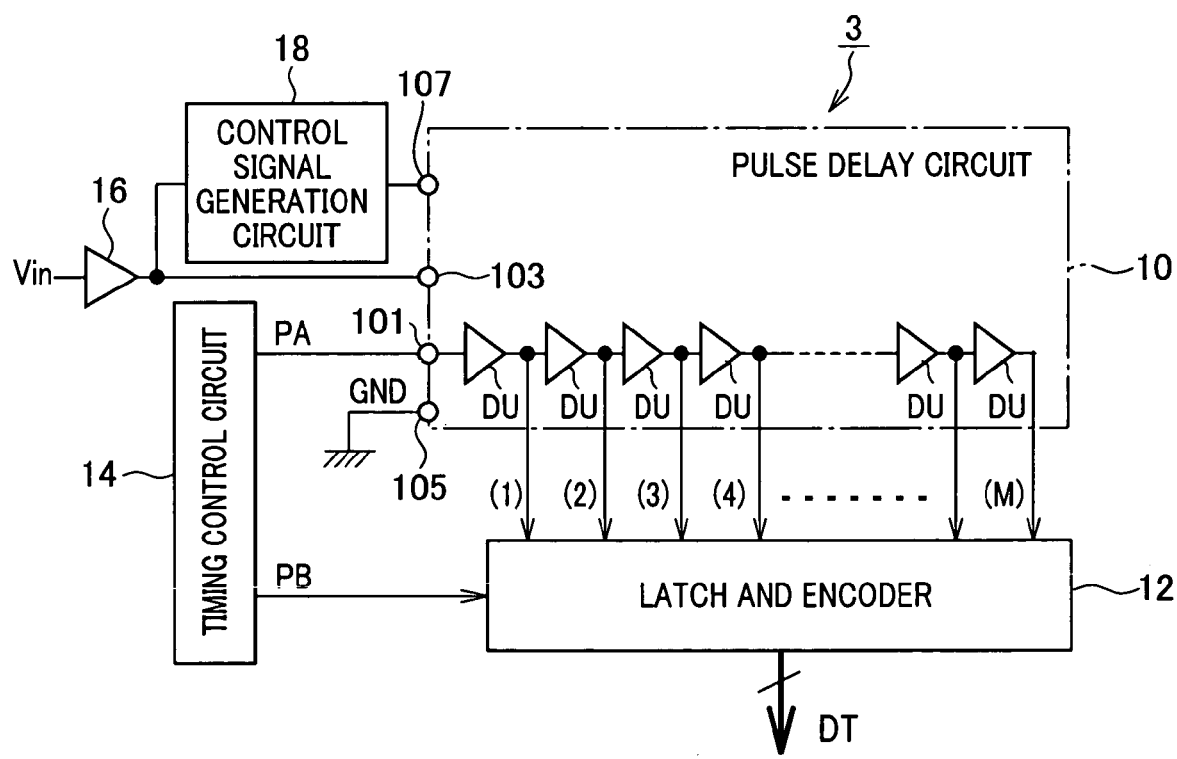
FIG. 6 is a block diagram showing a configuration of an A/D converter according to a second embodiment.

FIG. 6 is a block diagram showing an overall configuration of an A/D converter 3 according to the second embodiment.

Only a portion of the configuration of the A/D converter 3 differs from that of the A/D converter 1 according to the first embodiment. Therefore, portions of the configuration that are the same are given the same reference numbers, and explanations thereof are omitted. The portion of the configuration that differs will mainly be described.

As shown in FIG. 6, the A/D converter 3 includes a control signal generation circuit 18. The control signal generation circuit 18 generates a control signal VC that is applied to the control terminal 107 based on an analog input signal Vin inputted via the buffer 16.

The control signal generation circuit 18 is configured to generate the control signal VC having a voltage level VDD+ (VDD−Vin), with a maximum voltage of the analog input signal Vin serving as VDD. A circuit such as this can be easily configured using, for example, an inverting amplifier that uses an operational amplifier. Therefore, a detailed explanation thereof is omitted.

In other words, when VDD=5V, the voltage level of the control signal VC increases from 5V to 6V to 7V when the voltage level of the analog input signal Vin decreases from 5V to 4V to 3V.

In the A/D converter 3 configured as described above, the back gate voltage of the specific transistor Tp configuring the delay unit DU is changed such that the on-resistance of the specific transistor Tp increases as the drive voltage decreases. Therefore, compared to the A/D, converter 1 according to the first embodiment, the voltage resolution of the A/D conversion data can be further improved and measurement time can be further shortened.

Third Embodiment

Next, a third embodiment will be described.

Figure 7:
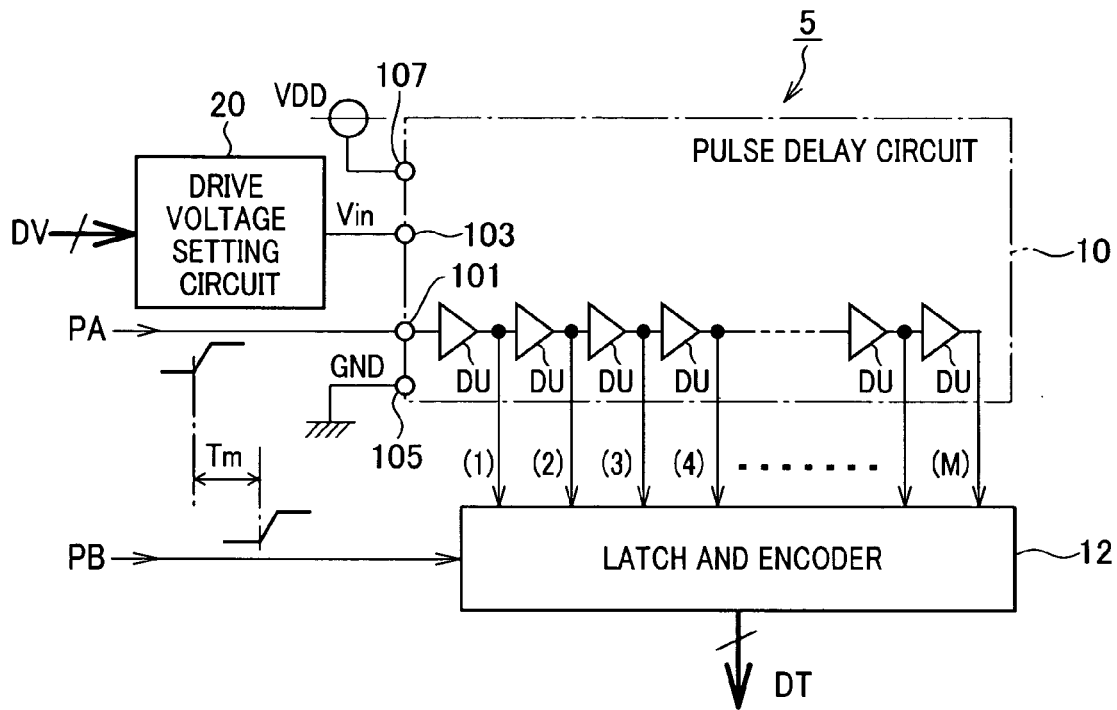
FIG. 7 is a block diagram showing a configuration of an A/D converter according to a third embodiment.

FIG. 7 is a block diagram showing an overall configuration of a time measurement circuit 5 to which the present invention is applied.

As shown in FIG. 7, the time measurement circuit 5 includes the pulse delay circuit 10, the latch and encoder 12, and a drive voltage setting circuit 20. The pulse delay circuit 10 and the latch and encoder 12 are configured in a manner similar to those configuring the A/D converter 1 according to the first embodiment. The drive voltage setting circuit 20 sets the drive voltage Vin applied to the positive drive terminal 103 of the pulse delay circuit 10.

The pulse signal PA supplied from an external source is applied to the pulse input terminal 101 of the pulse delay circuit 10. The negative drive terminal 105 is grounded. The fixed voltage VDD (Vmax=VDD=5V, according to the third embodiment) set to be the maximum voltage Vmax of the drive voltage Vin set by the drive voltage setting circuit 20 or higher is applied to the control terminal 107 as a control signal.

In the time measurement circuit 5 configured as described above, when the pulse signal PA for start-up is inputted into the pulse delay circuit 10, via the pulse input terminal 101, the pulse delay circuit 10 operates and transmits the pulse signal PA while successively delaying the pulse signal PA by the delay time of the delay unit DU.

Then, when the pulse signal PB for measurement is inputted into the latch and encoder 12, the latch and encoder 12 detects the position of the pulse signal within the pulse delay circuit 10. The latch and encoder 12 outputs numeric data corresponding with the number of delay unit DU stages the pulse signal passes as time measurement data DT corresponding to a time interval from an input timing of the pulse signal PA to the input timing of the pulse signal PB.

Then, in the time measurement circuit 5, when the drive voltage setting circuit 20 sets the voltage setting data DV such that a drive voltage Vin with a low voltage level is supplied, because the delay time of each delay unit DU configuring the pulse delay circuit 10 increases, the time resolution of the time measurement data DT (equivalent to a delay time Tdu of one delay unit DU stage) is lowered. However, a measurable time range TW(=Tdu×M) increases.

On the other hand, when the drive voltage setting circuit 20 sets the voltage setting data DV such that a drive voltage Vin with a high voltage level is supplied, because the delay time of each delay unit DU configuring the pulse delay circuit 10 becomes shorter, the measurable time range shortens. However, the time resolution of the time measurement data DT improves.

As described above, in the time measurement circuit 5, when the drive voltage Vin set by the drive voltage setting circuit 20 is changed, the change in the on-resistance of the specific transistor Tp becomes greater than that of a conventional device in which the back gate voltage equal to the source voltage. Therefore, the back gate voltage of the specific transistor Tp is controlled such that the maximum measurement time controllable by the drive voltage Vin is long.

Thus, in the time measurement circuit 5, the time range of the measurement time that can be handled can be widened without increasing the size of the circuit.

According to the third embodiment, the fixed voltage VDD is applied to the control terminal 107 as the control signal.

Fourth Embodiment

Figure 8:
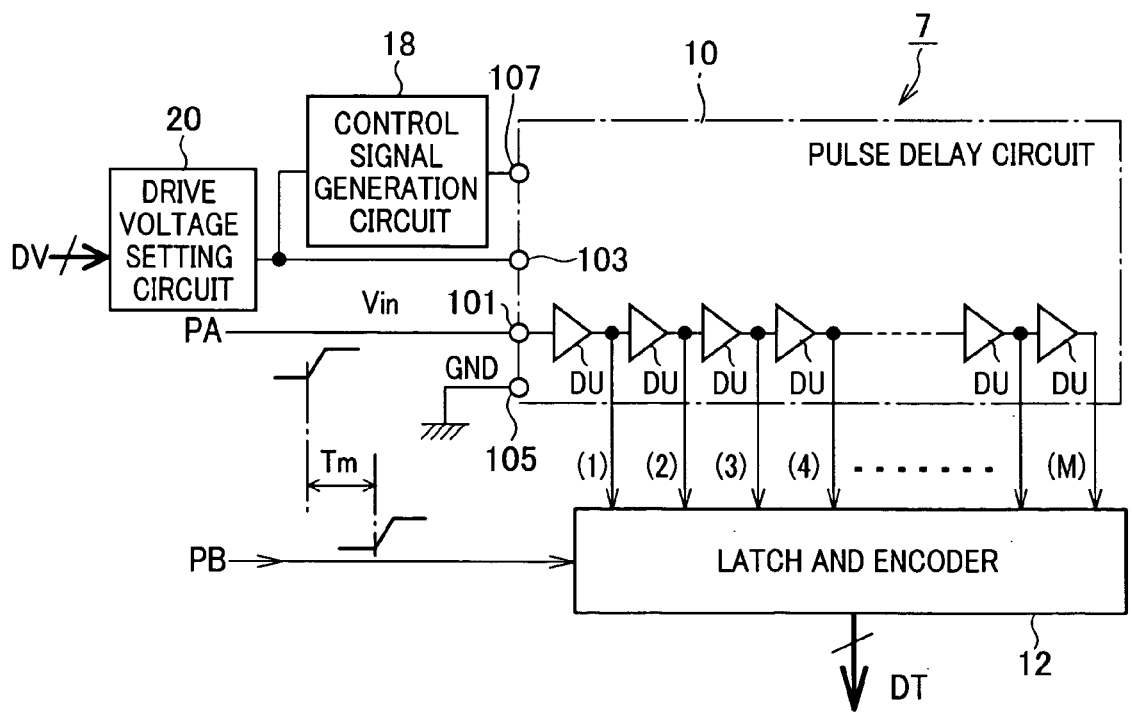
FIG. 8 is a block diagram showing a configuration of an A/D converter according to the fourth embodiment.

However, as in a time measurement circuit 7 shown in FIG. 8, in a manner similar to that according to the second embodiment, the control signal generation circuit 18 that generates the control signal based on the drive voltage Vin can be provided. The voltage level of the control signal can be controlled based on the drive voltage Vin, such that the change in the on-resistance of the specific transistor Tp (therefore, the change in the delay time of the delay unit DU) becomes greater.

Other Embodiments

According to the above-described embodiments, between the two MOS transistors configuring the inverter circuit INV, the PMOS transistor Tp serves as the specific transistor. However, the NMOS transistor Tn can serve as the specific transistor.

Figure 9:
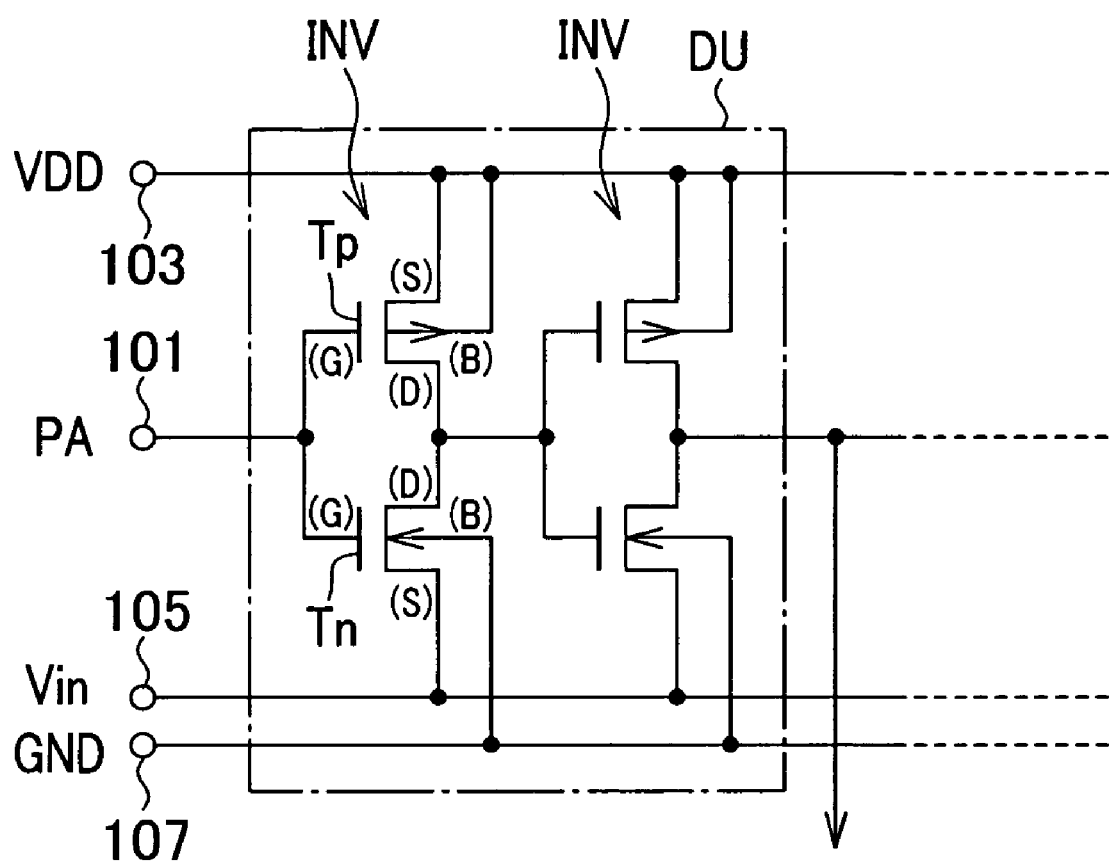
FIG. 9 is a circuit diagram showing another configuration example of the delay unit.

In this case, as shown in FIG. 9, the source S and the back gate B of the PMOS transistor Tp are connected to the positive drive terminal 103 to which the power supply voltage VDD is applied. The source S of the NMOS transistor Tn is connected to the negative drive terminal 105 to which the analog input signal Vin is applied. The back gate B of the NMOS transistor Tn is connected to the control terminal 107 to which the control signal is applied. The voltage level of the control signal can be a fixed voltage (such as 0V), in a manner similar to that according to the above-described first embodiment and third embodiment. Alternatively, the voltage level can be a variable voltage based on the analog input signal Vin that allows greater change in the on-resistance of the specific transistor Tn, in a manner similar to that according to the above-described second embodiment and fourth embodiment.

According to the above-described embodiments, the pulse delay circuit 10 is configured by the delay units DU being serially connected. However, a ring-type delay line in which the delay units DU are connected to form a ring circuit can also be used (refer to a ring-type pulse delay circuit). In this case, an orbit counter that counts the number of times a pulse signal orbits the ring delay line is provided. Numeric data in which the output from the latch and encoder 12 supplies the lower bits and the output from the orbit counter supplies the upper bits is outputted.

According to the above-described embodiments, the delay unit DU is configured by the inverter circuit INV formed by the CMOS transistor. However, as long as the circuit is a gate circuit including an NMOS transistor or a PMOS transistor connected such that a pulse signal is applied to the gate and a control signal is applied to the source, the configuration of the delay unit DU is limited to neither the CMOS transistor nor the inverter circuit. In other words, a gate circuit configuring the delay unit DU can be configured using an AND circuit, an NAND circuit, an OR circuit, an NOR circuit, an XOR circuit, an XNOR circuit, and the like. The circuit can also be an inverter circuit, a buffer circuit, and the like including a single MOS transistor.

What is claimed is:

1. A method for driving a pulse delay circuit that generates propagation delay for a pulse signal to be transmitted through the pulse delay circuit, comprising steps of:
preparing a plurality of delay units connected to each other to be configured as the pulse delay circuit for giving the propagation delay to the pulse signal that is successively delayed by each of the delay units, each delay unit comprising plurality of transistors that include a specific transistor having first and second terminals; and
driving the first and second terminals of the specific transistor with a first and second signals respectively in order to change a delay time of the each delay unit, wherein the voltages of the first and second signals are controlled separately in order to produce a change in on-resistance of the specific transistor that causes a change in the delay time of each delay unit such that the change in the on-resistance of the specific transistor is greater than that when the first and second terminal of the specific transistor are electrically tied together.

2. The method according to claim 1, wherein
the specific transistor is a metal-oxide semiconductor transistor in which the source of the transistor corresponds to the first terminal and the back gate of the transistor corresponds to the second terminal.

3. The method according to claim 1, wherein
the delay unit is configured to include at least one gate circuit comprising the plurality of transistors.

4. A pulse delay circuit configured by delay units serially connected in a plurality of stages or connected to form a ring circuit, a delay unit delaying a pulse signal by a delay time based on a voltage level of a drive signal, and transmits the pulse signal while successively delaying the pulse signal by the delay time of the delay unit, comprising:
a gate circuit that has at least one gate circuit arranged in the delay unit, the gate circuits are serially connected in a plurality of stages, the gate circuit including at least one specific transistor configured by a metal-oxide semiconductor of which the gate is driven by the pulse signal and of which the source is driven by the drive signal; and
a control terminal for applying a control signal to a back gate of the specific transistor, the control terminal being arranged in the pulse delay circuit, the control signal used to control a back gate voltage to produce a change in on-resistance of the specific transistor in relation to a voltage level of the drive signal greater than that when the back gate voltage and a source voltage of the specific transistor are electrically tied together.

5. The pulse delay circuit according to claim 4, wherein
the gate circuit is configured using a complementary metal-oxide semiconductor transistor; and
the specific transistor is one of a p-type metal-oxide semiconductor transistor and an n-type metal-oxide semiconductor transistor configuring the complementary metal-oxide semiconductor transistor.

6. The pulse delay circuit according to claim 4, wherein the gate circuit is an inverter circuit.

7. The pulse delay circuit according to claim 5, wherein the gate circuit is an inverter circuit.

8. The pulse delay circuit according to claim 4, further comprising:
a control signal generation circuit that generates the control signal and supplies the control terminal with the control signal.

9. The pulse delay circuit according to claim 5, further comprising:
a control signal generation circuit that generates the control signal and supplies the control terminal with the control signal.

10. The pulse delay circuit according to claim 6, further comprising:
a control signal generation circuit that generates the control signal and supplies the control terminal with the control signal.

11. An analog-to-digital conversion circuit, comprising:
a pulse delay circuit according to claim 4, and an encoding circuit that generates numeric data corresponding to the number of delay unit stages through which the pulse signal passes within the pulse delay circuit during a measurement time set in advance, wherein
an analog input signal to be converted from analog to digital is applied to the pulse delay circuit as the drive signal and the numeric data generated by the encoding circuit is outputted as analog-to-digital conversion data indicating a voltage level of the analog input signal.

12. A time measurement circuit, comprising:
a pulse delay circuit according to claim 4;
an encoding circuit that generates numeric data corresponding to the number of delay unit stages through which the pulse signal passes within the pulse delay circuit during a specified measurement time; and
a voltage setting circuit that variably sets a drive voltage of the pulse delay circuit, wherein
when a pulse signal for start-up the pulse delay circuit is inputted from an external source, the pulse delay circuit starts transmission of the pulse signal and, when a pulse signal for measurement is inputted from an external source, the encoding circuit generates the numeric data of which the measurement time is taken from the input of the pulse signal for start-up to the input of the pulse signal for measurement and outputs the numeric data as time measurement data indicating a time interval from an input timing of the pulse signal for start-up to an input timing of pulse signal for measurement.

* * * * *